United States Patent
Wells et al.

(10) Patent No.: US 12,191,662 B2
(45) Date of Patent: Jan. 7, 2025

(54) ELECTRIC GRID ANOMALY LOCATION, ISOLATION AND SERVICE RESTORATION

(71) Applicant: PXiSE Energy Solutions, LLC, San Diego, CA (US)

(72) Inventors: Charles H. Wells, San Diego, CA (US); Raymond A. de Callafon, San Diego, CA (US); Patrick T. Lee, San Diego, CA (US)

(73) Assignee: PXISE ENERGY SOLUTIONS, LLC, San Diego, CA (US)

( * ) Notice: Subject to any disclaimer, the term of this patent is extended or adjusted under 35 U.S.C. 154(b) by 0 days.

(21) Appl. No.: 18/625,938

(22) Filed: Apr. 3, 2024

(65) Prior Publication Data

US 2024/0332965 A1 Oct. 3, 2024

Related U.S. Application Data

(60) Provisional application No. 63/456,772, filed on Apr. 3, 2023.

(51) Int. Cl.
*H02J 3/00* (2006.01)
*G01R 31/08* (2020.01)
*H02J 3/38* (2006.01)

(52) U.S. Cl.
CPC .......... *H02J 3/0012* (2020.01); *G01R 31/086* (2013.01); *G01R 31/088* (2013.01); *H02J 3/388* (2020.01)

(58) Field of Classification Search
None
See application file for complete search history.

(56) References Cited

U.S. PATENT DOCUMENTS

| 9,535,917 B1* | 1/2017 | Lin | G06F 16/148 |
| 2011/0082654 A1* | 4/2011 | Dickens | H02J 3/242 |
| | | | 702/188 |

(Continued)

FOREIGN PATENT DOCUMENTS

CN 103529418 A * 1/2014

OTHER PUBLICATIONS

International Search Report and Written Opinion issued for Application No. PCT/US2024/022800, 9 pages, dated Jun. 14, 2024.

*Primary Examiner* — David Earl Ogg
(74) *Attorney, Agent, or Firm* — Gray Ice Higdon

(57) ABSTRACT

Using real or estimated power measurements to detect one or more anomalies in an AC electric network. In some implementations, one or more actions can be automatically performed in response to detection of the anomaly. Such action(s) can include causing automatic control of electrical resource(s) of the AC electric network to mitigate the detected anomaly/anomalies. For example, such action(s) can include automatically isolating the AC electric network in response to detecting the AC electric network has one or more anomalies, and optionally restoring the AC electric network after the abnormal conditions are no longer detected. For instance, this can include a main AC electric network isolating an AC electric subnetwork in response to detecting abnormal conditions in the AC electric sub-network or an AC electric sub-network isolating and islanding itself from the main AC electric network in response to detecting abnormal conditions in the main AC electric network.

20 Claims, 1 Drawing Sheet

(56) References Cited

U.S. PATENT DOCUMENTS

| | | | |
|---|---|---|---|
| 2012/0082159 A1* | 4/2012 | Taft | H04L 49/35 |
| | | | 370/390 |
| 2015/0301101 A1* | 10/2015 | Abido | G01R 31/088 |
| | | | 702/59 |
| 2016/0025785 A1* | 1/2016 | Liu | G01R 29/12 |
| | | | 702/66 |
| 2016/0239010 A1 | 8/2016 | Mcdaniel et al. | |
| 2017/0146585 A1* | 5/2017 | Wang | G01R 23/02 |
| 2017/0179720 A1* | 6/2017 | Porter | H02J 3/16 |
| 2017/0192416 A1* | 7/2017 | Bechstedt | H02J 13/00034 |
| 2020/0212709 A1* | 7/2020 | de Callafon | H02J 3/0012 |
| 2020/0293033 A1 | 9/2020 | He et al. | |

* cited by examiner

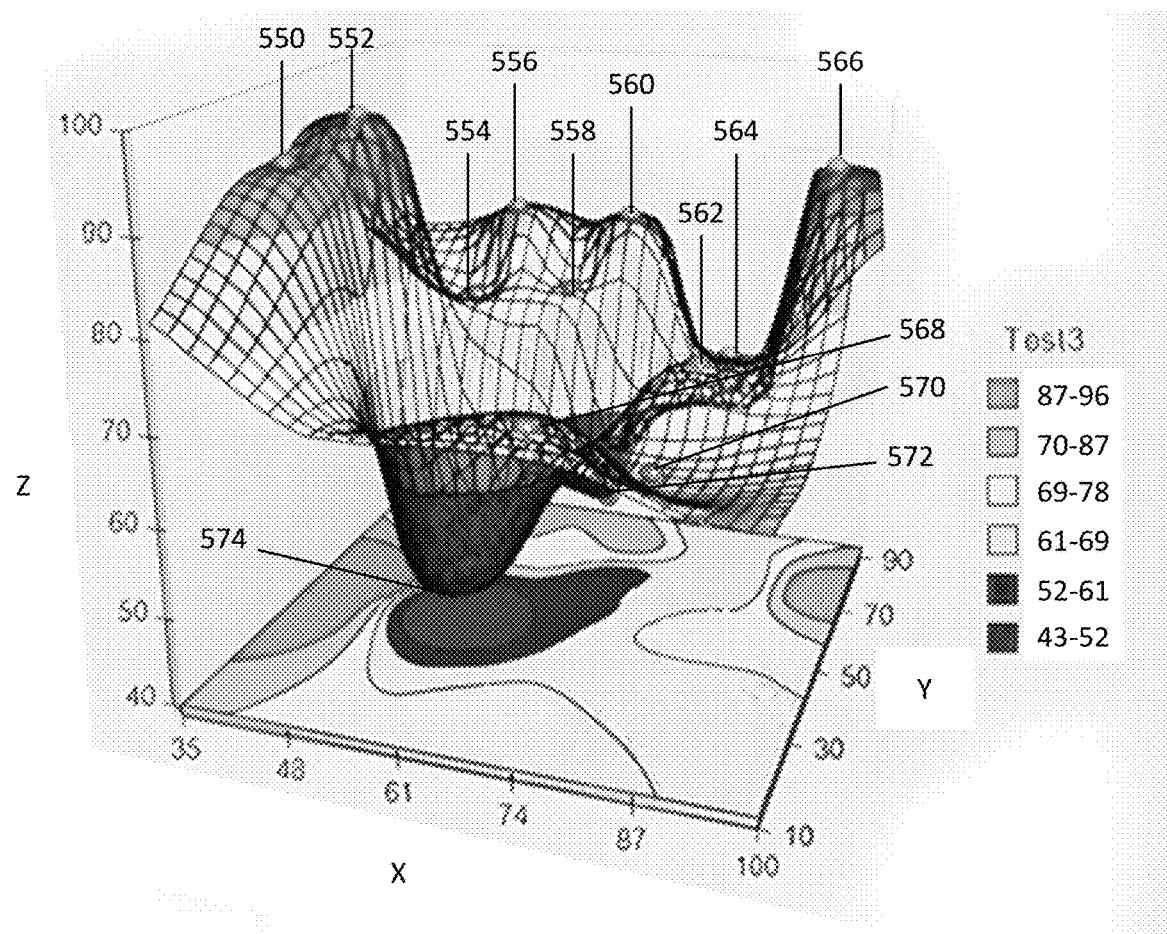

ELECTRIC GRID ANOMALY LOCATION, ISOLATION AND SERVICE RESTORATION

BACKGROUND

Grid anomalies are abnormal power, voltage, and/or current conditions in an alternating current (AC) electric network that negatively impact electric service quality and/or reliability. Such grid anomalies can include abnormal deviation, in one or more phases in the AC electric network, of: real power P, reactive power Q, voltage magnitude and angle (voltage phasor v), current magnitude and angle (current phasor i), and/or frequency f. Some specific examples of grid anomalies include, but are not limited to: low impedance faults with high fault current that would result in protective relay action; frequency and/or voltage oscillations; and high impedance faults that may not trigger any protective relay actions.

SUMMARY

Implementations disclosed herein provide a system and/or a method for using synchrophasors, and/or estimates of the synchrophasors, to detect one or more anomalies in an AC electric network. In some of those implementations, one or more actions can be automatically performed in response to detection of the anomaly. Such action(s) can include causing human viewable alert(s) to be rendered at client device(s) and/or causing automatic control of electrical resource(s) of the AC electric network to mitigate the detected anomaly/anomalies. For example, such action(s) can include automatically isolating the AC electric network in response to detecting the AC electric network has one or more anomalies, and optionally restoring the AC electric network after the abnormal conditions are no longer detected. For instance, this can include a main AC electric network isolating an AC electric subnetwork in response to detecting abnormal conditions in the AC electric sub-network or an AC electric sub-network isolating and islanding itself from the main AC electric network in response to detecting abnormal conditions in the main AC electric network.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

BRIEF DESCRIPTION OF THE DRAWINGS

FIG. 1 depicts a non-limiting example of a surface of a measured sheet.

DETAILED DESCRIPTION

Prior to turning to the FIGURES, a non-limiting overview of various implementations is provided.

Implementations disclosed herein provide methods and systems that enable reliable operation of an electric grid that has up to one hundred percent inverter-based renewable generation. Such an electric grid, with a high percentage of inverter-based renewable generation, can have significant variability of real and reactive power from renewables, and can have low or no system inertia. The low or no system inertia of such an electric grid can be due to limited presence, or no presence, of spinning generators (e.g., fossil-fuel based generators). Accordingly, electric frequency is not a reliable parameter for supply-demand balance control in such an electric grid with a high percentage of inverter-based renewable generation. Some versions of the implementations that enable reliable operation of such an electric grid, comprehensively mitigate disruptive anomalies by automatically isolating section(s) of the electric grid. The automatic isolating of section(s) of the electric grid is responsive to detecting an anomaly or multiple anomalies in those section(s) or in the main grid and occurs before the disruptive anomaly/anomalies cause occurrence of a blackout. In some of those versions, the isolated section(s) are then later automatically reconnected to the main electric grid with minimal customer impact. The later automatic reconnecting can occur responsive to no longer detecting the anomaly/anomalies. Further, the automatic reconnecting of a section can be when the voltage angle of the section matches that of the main grid, thereby preventing disruptive anomalies from the automatic reconnecting.

In some implementations, the main electric grid is controlled by a master controller that implements anomaly location, isolation, and service restoration (ALISR) functions disclosed herein. The master controller coordinates with controllable resources that are at least selectively electrically connected to the main grid. The controllable resources can include controllable local microgrids that each also implement built-in ALISR functions disclosed herein. In normal operating modes, the master controller ALISR functions are responsible for dispatching real and reactive power commands to the controllable local microgrids with built-in ALISR functions, while maintaining robustness and security of the main grid. The dispatching of the real and reactive power commands can optionally be based on a Security Constrained Economic Dispatch (SCED) method, which can be a system level optimizer. In implementing the ALISR functions, the master controller can continually search for weak areas of the main grid and, in response to detecting weak area(s) of the main grid (e.g., one(s) with a detected anomaly), intentionally isolate them to maintain system security and stability. The isolated/islanded area(s) are then later seamlessly reconnected and rejoined to the main grid as the main grid and/or the isolated areas become stable (e.g., when anomalies are no longer detected). As one specific example, an island or remote community grid can operate as a network of microgrids according to the severity of a storm impacting the electric distribution system.

Measurements of an electric grid are typically measured at each bus of the electric grid. Obtaining measurements of an electric grid at each bus provides a physically and/or electrically geospatially distributed set of observations in time. When a bus does not have an actual measurement, an estimate of the measurement can be generated. For example, an estimate of a measurement at a bus can be generated using a network model. In implementations disclosed herein, the measurements of an electric grid that are measured or estimated at each bus can include bus voltage phasor, branch current phasor, bus frequency, and/or a precision time stamp of such measurements. For a collection of (e.g., each for a respective bus and each taken at or near the same time) any one of those measurements, such as the voltage angle of a voltage phasor, a three-dimensional (3D) surface can be formed that can be used to detect anomalies.

One visualization of such a 3D surface is a waving sheet where the x and y are the geospatial coordinates of the measurements and the z axis is the value of the measurements. For example: a first x, y coordinate can correspond to a first geospatial location of a first bus and the z value at the first x, y coordinate can correspond to a most recent power measurement at the first bus; a second x, y coordinate can correspond to a second geospatial location of a second bus and the z value at the second x, y coordinate can correspond to a most recent power measurement at the second bus; etc. Continuing with the example, the surface of the waving sheet can be formed based on the z values at all of the measurement coordinates. For instance, the z values of all the measurement coordinates can each be a local minima or a local maxima in the waving sheet. Accordingly, each location on the surface of the waving sheet represents a location (x, y coordinate) and a measured or estimated value (z value) at that location.

The shape of the waving sheet changes continuously as new measurements are continuously obtained and the shape of the waving sheet can be used to determine whether one or more anomalies are presented. There can be different types of waving sheets, each being for a different type of measurement. For example, a first continuously updated waving sheet can be based on voltage phasor measurements (i.e., z-values correspond to voltage phasor measurements) and a second continuously updated waving sheet can be based on current phasor measurements (i.e., z-values correspond to current phasor measurements), etc. There can also be a different waving sheet for each phase of a multi-phase AC electric grid. For example, a first continuously updated waving sheet can be based on voltage phasor measurements in a first phase of a three-phase AC electric grid, a second continuously updated waving sheet can be based on voltage phasor measurements in a second phase of the three-phase AC electric grid, etc.

For each type of sheet there can be a nominal sheet that represents an expected shape if no anomalies are present. For example, if voltage measurements are represented by the sheet, the shape would be flat for each voltage distribution level in the network, if all voltage measurements are the same. A typical power network can have multiple voltage levels, such as 115 kV, 34.5 kV, 13 kV, and 6 kV in a small island wide distribution system. At each voltage level in such a distribution system, there would be three sheets in a three phase AC system (i.e., one sheet for each phase). There are certain variables that are independent of voltage magnitude, such as real power, reactive power, and voltage angles.

Accordingly, there can be nominal sheets that each have a corresponding shape that corresponds to normal operating conditions. For example, under normal operating conditions a voltage magnitude sheet will be relatively flat with a few small ripples in the surface. As another example, under normal operating conditions a voltage angle sheet will have relatively larger (relative to the voltage magnitude sheet) hills and valleys in the sheet, with known locations and measured heights.

There are often anomalies in an electric grid (power system) due to various events such as switching of equipment, changes in supply and demand, equipment insulation degradation, contact corrosion of connectors in overhead wires and underground cables, changes in weather conditions, physical damage from storms, and/or physical damage from third-party activities such as a car hitting a power pole. Anomalies from the expected activities in a power system can be determined by determining differences between nominal sheet(s) and measured sheet(s). Statistical deviation(s) from the nominal sheet(s), such as mean deviation over a time period, can be used to determine whether there is an anomaly and/or to determine the degree of anomaly. These statistical deviation(s) can include deviations between nodes in the network and/or deviations at node(s) individually. A node in a network can be a measurement location in the network, such as a measurement location that corresponds to a bus of the network. As one example, for a voltage angle sheet the rate of change of voltage angle over time at each node should not exceed a threshold (e.g., a predetermined fixed threshold) at any time during the day. An anomaly can be detected if the rate of change at one or more nodes is determined to exceed the threshold. As another example, for a voltage angle sheet the angle difference between any two nodes should not exceed a threshold (e.g., a predetermined fixed threshold) at any time during the day. An anomaly can be detected if the angle change different between one or more pairs of nodes is determined to exceed the threshold.

The nominal shape of a nominal sheet can be determined, for example, from historical data or by combining historical data with a network model. The nominal shape is an estimated shape of the surface at any point in time. The nominal shape can vary for different points in time. For example, the nominal shape can be dependent on (and optionally vary based on) the time of day, day of the week, season of the year, and/or local weather conditions. For instance, a first nominal sheet for voltage magnitude can be generated from historical data from weekday mornings and be used during weekday mornings, a second nominal sheet for voltage magnitude can be generated from historical data from weekend evenings and be used during weekend evenings, etc. Also, for instance, a first nominal sheet for voltage magnitude can be generated from historical data from times when the temperature was within a first range and be used during times when the temperature is within the first range, a second nominal sheet for voltage magnitude can be generated from historical data from times when the temperature was within a second range and be used during times when the temperature is within the second range, etc.

In various implementations, in determining whether an anomaly is detected, an anomaly is not detected if the rate of change of the measured value at any point and at any time of the day does not exceed a threshold, the difference between adjacent nodes in the network does not change by more than a threshold, and/or the rate of change over time does not exceed a threshold. In some of those various implementations, in determining whether an anomaly is detected, an anomaly is detected if the rate of change of the measured value at any point and at any time of the day does exceed a threshold, the difference between adjacent nodes in the network does change by more than a threshold, and/or the rate of change over time does exceed a threshold.

In some implementations, in determining whether an anomaly is present, the magnitude, direction, and/or periodicity of the waves on a measured sheet's surface can be considered. The magnitude, direction, and/or periodicity can be determined based on a vector of magnitude and direction from each node that can have more than one "degree" as defined in graph theory. For example, if the waves are nominally from Northeast to Southwest, but change from East to West, it is likely that the grid is moving to a new equilibrium point that is possibly unstable. The shape of the surface will also indicate the stability margin of the grid. This is similar to a "nose curve", where the slope of the change in voltage with the change in real power is a key indicator of voltage stability. A system with a large negative value of this vector is a measure of stability margin. The shape of the surface is also related to the stiffness or strength of the grid. For example, a stiff grid will exhibit a surface that is relatively flat and may have small ripples in a fixed direction over a period of time. Some of the techniques to determine the location of the anomaly include the use of the measurements from two adjacent nodes proportional to the computed electrical impedance between the two nodes.

To avoid an unstable condition or weak condition in the main grid from a system perspective, the weak portions of the grid are disconnected at the optimal location in the grid. From a local microgrid perspective, switching from a grid-connected to an island mode may be warranted when the main grid becomes unstable.

As described herein, the nominal shape of a sheet can be computed by using historical data, a network flow model, or combining historical data and the model. Combining historical data and the model is also known as an estimator or observer.

In order to maximize the resilience of the power grid, it will be necessary to occasionally isolate portions of the grid. The timing and locations of the disconnections are based on deviations from nominal behavior (i.e., detection of an anomaly), such as those detected using measured sheet(s) and optionally nominal sheet(s). The power grid includes multiple nodes (or vertices) that can be disconnected seamlessly when an anomaly occurs. The decision to disconnect is based on the main grid controller disconnecting nodes based on its view of the surface(s) of sheet(s) and/or based on observations of the surface(s) of sheet(s) by the sub-network serving a specific node. In some cases, a node in the network may be serving loads as a microgrid, where the microgrid controls the flow from the node. Note that some nodes will have multiple feeders (often referred to as degrees), so that the flow from any of the edges of the node can be controlled. Thus, the microgrid can autonomously disconnect from the main grid based on its observations of surface(s) of sheet(s) at its point of connection to the grid.

In the case of a high-impedance fault, that does not trip a high current sensing relay, the shape change in surface(s) of sheet(s) can be used by a local microgrid to disconnect from the main grid to preserve itself. This will cause a perturbation in the entire surface that may smooth the surface making the main grid more stable, or it could deteriorate the surface forcing other microgrids to disconnect from the main grid. In either case, most loads are still served. The departing microgrid will automatically continue to supply its loads by injecting power from inside its boundaries to meet the island load. This is normally supplied by energy storage devices inside the microgrid boundaries.

Similarly, the main grid controller can observe an anomaly in the surface and order a microgrid to disconnect from the main grid. For example, the main grid controller can transmit a command for the microgrid to disconnect from the main grid. In this case the microgrid may, in response to receiving the command, either open its breaker connecting to the main grid or set its flow setpoints to zero in which case the microgrid is virtually islanded.

The main grid controller observes the shape of the surface(s) of measured sheet(s) at all nodes and can determine a loss of strength in a given area, by observing the magnitude of the deviations from the surface(s) of nominal sheet(s). In a case where deviation(s) for node(s) are nearing anomaly threshold(s), the main controller can make an adjustment to the setpoints of the microgrid(s) at those node(s). For example, the main controller can transmit command(s) with new setpoints to the microgrid(s) at those node(s). The dispatch will raise or lower the surface at the point(s) that correspond to those node(s) to smooth the surface and retain the strength of the electric grid, mitigating occurrence of an actual anomaly. This is essentially flattening the surface(s) of measured sheet(s). The main grid controller can issue these commands to all nodes in the system to continually maximize grid stiffness. This is important in grids with high levels of variable renewable generation and EV charging. The flattening process of the main grid controller could occur at very high rates (e.g., 60 Hz or greater).

The rippling of the surface(s) of measured sheet(s) can also be controlled by the main grid controller. In this process, the main grid controller issues high speed real and reactive power commands to the microgrids under its control. The purpose is to dampen the oscillations in the grid caused by uncontrolled generation and load. It has recently been observed that oscillations occur at 11-25 Hz in some grids. Accordingly, the controller must send high rate signals to the dependent microgrids.

A network that has been disconnected by the main controller or by individual actions of a child microgrid, is reconnected either by the main controller or by the individual microgrid itself.

When the main controller observes that the surface(s) of measured sheet(s) are within its operating envelope, it may send dispatch orders to child microgrid(s) to reconnect at the observation time or at a specified time in the future. The child microgrid(s) will then execute a reconnection procedure that includes forcing its voltage angle to match that of the main grid or, if a microgrid has enabled an angle tracking feature, the reconnection can occur immediately.

The microgrid may also determine to reconnect autonomously by observing that the surface at its node is within its operating range, in which case the microgrid will autonomously reconnect, provided that it has controlled its voltage angle to equal that of the main surface.

The shape of a measured surface of a sheet can be determined using one or more artificial intelligence (AI) rules and/or machine learning algorithms. One non-limiting example is to use pattern recognition algorithms to detect anomalies. Such pattern recognition algorithms can be the same as, or similar to, those used in self-driving vehicles to detect presence of certain features and/or to those used in other safety related pattern recognition methods. For example, the three-dimensional surface of a measured sheet can be processed, as a bit-map or other file type, by a pattern recognition algorithm and that processing can be used to determine abnormal shapes. As a particular example, a machine learning model can be trained for use in processing images of the three-dimensional surface of the sheet to generate output (e.g., a probability) that reflects likelihood that an anomaly is present. For instance, the machine learning model can be trained based on supervised training instances that each include input of a training image of a three-dimensional surface of the sheet and ground truth output that indicates whether one or more anomalies are present and, optionally, location(s) of the anomalies.

An additional or alternative technique that can be used to determine whether an anomaly is present is to extract features of the three-dimensional surface of the sheet and process the extracted features to determine whether anomalies are present and, optionally, location(s) of the anomalies. For example, clustering of features can be used to determine whether an anomaly is present. For instance, a cluster area can be determined that reflects an area for extracted features when no anomaly is present, and an anomaly can be determined to be present when extracted features are not in that cluster or are a threshold distance outside of that cluster. Each cluster can optionally correspond to a different node. An additional or alternative approach is to use the spectral content of the surface. This can include detecting changes in the wave patterns such as amplitude, periodicity, and/or phase shift.

A non-limiting example of a surface of a measured sheet is shown in FIG. 1. In this example, the X axis is latitude, the Y axis is longitude, and the Z axis is any one of the parameters representing the measured or estimated surface value, such as voltage magnitude or voltage angle. For example, the Z axis can be the unwrapped angle derived from data from phasor measurement units (PMUs) at nodes of an electric network. For example, points 550, 552, 554, 556, 558, 560, 562, 564, 566, 568, 570, 572, and 574 can each correspond to a different node (e.g., a bus). The x, y locations of those points can correspond geospatially to the real physical locations of those nodes. Further, the z values for each of those points can correspond to real or estimated PMU measurements at those points. The shape of the surface of the measured sheet of FIG. 1 is a function of those points 550, 552, 554, 556, 558, 560, 562, 564, 566, 568, 570, 572, and 574. Put another way, the sheet is formed atop those points and the points are local maxima or minima in the sheet.

The areas shown in shading that corresponds to the "52-61" and "43-52" keys of FIG. 1 (near point 574) are likely to separate from the grid due to protection relay settings and/or due to high sensitivity and deviation of the represented value. A main controller of a main grid can use ALISR techniques disclosed herein to determine a planned islanding operation to stabilize the grid by intentionally opening breakers at selected area microgrid(s) that correspond geospatially to those areas.

In some implementations, a method implemented by processor(s) (e.g., processor(s) of a master controller or a child controller) is provided and includes obtaining phasor measurements. Each of the phasor measurements is for a corresponding network node of a plurality of geographically distributed network nodes of an alternating current (AC) electric network. The method further includes processing the phasor measurements to determine whether there is an anomaly in the AC electric network. Processing the phasor measurements to determine whether there is an anomaly can include determining whether one or more deviations are present based on comparing the phasor measurements to one or more reference nominal measurements and/or comparing the phasor measurements to one another.

These and other implementations of the technology disclosed herein can optionally include one or more of the following features.

In some implementations, the phasor measurements include actual phasor measurements that are each from a corresponding phasor measurement unit (PMU). Each of the PMUs are at a corresponding one of the corresponding network nodes. In some of those implementations, the phasor measurements include an estimated phasor measurement for at least one of the corresponding network nodes, such as estimated phasor measurements that are calculated using a digital model of the AC electric network.

In some implementations, the one or more deviations include a measure of change of state determined based on comparing the phasor measurements to the one or more reference nominal measurements. In some versions of those implementations, the one or more reference nominal measurements are generated based on historical measurements. In some of those versions, the historical measurements, used in generating the one or more reference nominal measurements, are specific to one or more temporal conditions and/or to one or more weather conditions and the reference nominal measurements are used in comparing the phasor measurements based on the one or more temporal conditions and/or the one or more weather conditions being present when the phasor measurements were obtained.

In some implementations, the phasor measurements are each for a corresponding geospatial location within the AC electric network and processing the phasor measurements includes using the corresponding geospatial locations in the processing. In some of those implementations, the one or more deviations include a measure of change of state determined based on comparing the phasor measurements to the one or more reference nominal measurements, and the one or more reference nominal measurements include multiple reference nominal measurements each corresponding to a different geospatial location in the AC electric network.

In some implementations, the one or more deviations include a relative comparison, of rate of change of state in two or more network nodes, determined based on comparing the phasor measurements to one another. In some of those implementations, the one or more deviations are determined by computing the singular value of the mathematical representation of the network.

In some implementations, the one or more deviations include a relative comparison, of the state of the connected nodes with respect to the electric parameters between the connected nodes, determined based on comparing the phasor measurements to one another.

In some implementations, processing the phasor measurements to determine whether there is an anomaly includes: generating a representation, of the phasor measurements, that is an n-dimensional surface with respect to the electrical topology of the network; and processing the n-dimensional surface to determine whether there is an anomaly. In some of those implementations, the n-dimensional surface is a three-dimensional surface with x and y coordinates that correspond geospatial locations of the AC electric network and z values that correspond to the phasor measurements.

In some implementations, the phasor measurements are generated and obtained in a moving window.

In some implementations, processing the phasor measurements to determine whether there is an anomaly includes determining that a deviation, that indicates an anomaly, is present in a given network node of the corresponding network nodes. In some versions of those implementations, the method further includes, in response to determining that the deviation, that indicates an anomaly, is present in the given network node, causing isolation of the given network node from the AC electric network. In some of those versions the method further includes causing the given network node to reconnect to the AC electric network when the deviation is no longer detected.

In some implementations, processing the phasor measurements to determine whether there is an anomaly includes determining that a deviation, that does not indicate an anomaly, is present in a given network node of the corresponding network nodes. In some of those implementations, the method further includes, in response to determining that the deviation, that does not indicate an anomaly, is present in the given network node, transmitting one or more setpoints to the given network node to mitigate the deviation.

In some implementations, processing the phasor measurements to determine whether there is an anomaly includes determining that a deviation, that does not indicate an anomaly, is present in a given network node of the corresponding network nodes, and the method further includes, in response to determining that the deviation, that does not indicate an anomaly, is present in the given network node:

dispatching one or more resources to maintain the strength and/or stiffness of the AC electric network.

Other implementations can include a non-transitory computer readable storage medium storing instructions executable by one or more processor(s) (e.g., a central processing unit(s) (CPU(s)), graphics processing unit(s) (GPU(s)), and/or tensor processing unit(s) (TPU(s))) to perform a method such as one or more of the methods described herein. Yet other implementations can include a system of one or more processors operable to execute stored instructions to perform a method such as one or more of the methods described herein. For example, the processor(s) can be of a master controller or a child controller implementing AFLISR technique(s) disclosed herein.

What is claimed is:

1. A method implemented by one or more processors, the method comprising:
    obtaining phasor measurements, each of the phasor measurements being for a corresponding network node of a plurality of geographically distributed network nodes of an alternating current (AC) electric network;
    processing the phasor measurements to determine whether there is an anomaly in the AC electric network, wherein processing the phasor measurements to determine whether there is the anomaly comprises determining whether one or more deviations are present based on:
        comparing the phasor measurements to one or more reference nominal measurements, wherein comparing the phasor measurements to the one or more reference nominal measurements comprises:
            generating a measured representation that is a three-dimensional surface with x and y coordinates that correspond to geospatial locations of the AC electric network, and that is formed based on measurement z values that correspond to the phasor measurements and that are at measurement x and y coordinates, of the x and y coordinates, for the geographically distributed network nodes; and
            comparing the three-dimensional surface, of the measured representation, to an additional three-dimensional surface of a nominal representation, of the reference nominal measurements, to determine whether there is the anomaly in the AC electric network;
    determining, based on comparing the three-dimensional surface to the additional three-dimensional surface, that one or more of the deviations are present in a given network node of the corresponding network nodes, wherein one or more of the deviations indicate that there is the anomaly in the AC electric network; and
    causing, in response to determining that one or more of the deviations are present in the given network node, isolation of the given network node from the AC electric network.

2. The method of claim 1, wherein the phasor measurements include actual phasor measurements that are each from a corresponding phasor measurement unit (PMU), each of the PMUs being at a corresponding one of the corresponding network nodes.

3. The method of claim 2, wherein the phasor measurements include an estimated phasor measurement for at least one of the corresponding network nodes.

4. The method of claim 3, wherein the estimated phasor measurement is calculated using a digital model of the AC electric network.

5. The method of claim 1, wherein one or more of the deviations include a measure of change of state determined based on comparing the phasor measurements to one or more of the reference nominal measurements.

6. The method of claim 5, wherein the one or more reference nominal measurements are generated based on historical measurements.

7. The method of claim 6, wherein the historical measurements, used in generating the one or more reference nominal measurements, are specific to one or more temporal conditions and/or to one or more weather conditions in which the reference nominal measurements were taken and wherein the reference nominal measurements are used in comparing the phasor measurements based on the one or more temporal conditions and/or the one or more weather conditions being present when the phasor measurements were obtained.

8. The method of claim 1, wherein one or more of the deviations include a measure of change of state determined based on comparing the phasor measurements to the one or more reference nominal measurements, and wherein the one or more reference nominal measurements include multiple reference nominal measurements each corresponding to a different geospatial location in the AC electric network.

9. The method of claim 1, wherein one or more of the deviations include a relative comparison, of a rate of change of state in two or more network nodes, determined based on comparing the phasor measurements to one another.

10. The method of claim 1, wherein one or more of the deviations include a relative comparison, of a state of the network nodes with respect to one or more electric parameters between the network nodes, determined based on comparing the phasor measurements to one another.

11. The method of claim 1, wherein the phasor measurements are generated and obtained in a moving window.

12. The method of claim 1, further comprising causing the given network node to reconnect to the AC electric network when one or more of the deviations are no longer detected.

13. The method of claim 1, wherein the nominal representation is generated from historical measurements.

14. A method implemented by one or more processors, the method comprising:
    obtaining phasor measurements, each of the phasor measurements being for a corresponding network node of a plurality of geographically distributed network nodes of an alternating current (AC) electric network;
    generating a three-dimensional surface with x and y coordinates that correspond to geospatial locations of the AC electric network, and that is formed based on measurement z values that correspond to the phasor measurements and that are at measurement x and y coordinates, of the x and y coordinates, for the geographically distributed network nodes;
    comparing the three-dimensional surface to an additional three-dimensional surface of a nominal representation;
    determining, based on comparing the three-dimensional surface to the additional three-dimensional surface, that a deviation, that does not indicate an anomaly in the AC electric network, is present in a given network node of the corresponding network nodes; and
    in response to determining that the deviation, that does not indicate the anomaly, is present in the given network node:
        transmitting one or more setpoints to the given network node to mitigate the deviation.

15. The method of claim 14, wherein the phasor measurements include actual phasor measurements that are each from a corresponding phasor measurement unit (PMU), each of the PMUs being at a corresponding one of the corresponding network nodes.

16. The method of claim 14, wherein the phasor measurements include an estimated phasor measurement for at least one of the corresponding network nodes.

17. The method of claim 16, wherein the estimated phasor measurement is calculated using a digital model of the AC electric network.

18. The method of claim 14, wherein the nominal representation is generated from historical measurements.

19. The method of claim 14, wherein the measurement z values, that correspond to the phasor measurements, are angle measurement z values.

20. The method of claim 14, wherein the measurement z values, that correspond to the phasor measurements, are voltage magnitude measurement z values.

* * * * *